May 30, 1967 R. A. RUEHRWEIN 3,322,575
GRADED ENERGY GAP PHOTOELECTROMAGNETIC CELL
Filed July 31, 1961 2 Sheets-Sheet 1
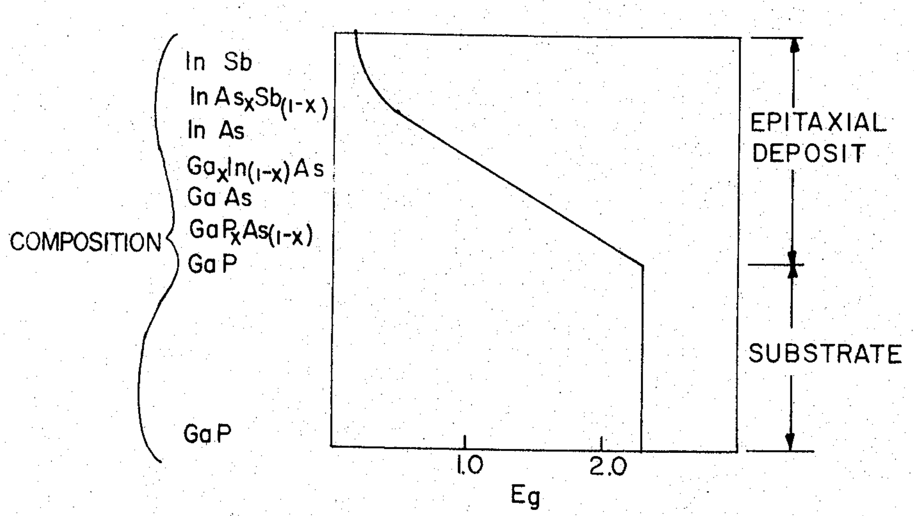
FIGURE I.
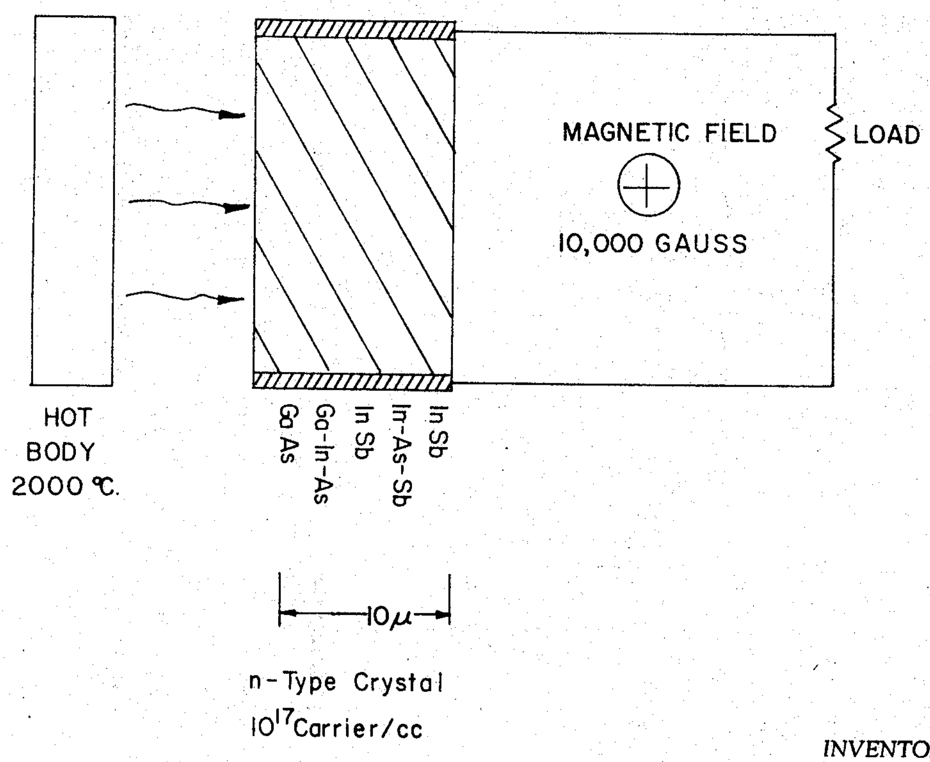
FIGURE 2.
INVENTOR.
ROBERT A. RUEHRWEIN
BY Herman O Bauermeister
ATTORNEY INVENTOR.
ROBERT A. RUEHRWEIN
BY Herman O. Bauermeister
ATTORNEY United States Patent Office 3,322,575
Patented May 30, 1967

3,322,575
GRADED ENERGY GAP PHOTOELECTRO-MAGNETIC CELL

Robert A. Ruehrwein, Dayton, Ohio, assignor to Monsanto Company, a corporation of Delaware Filed July 31, 1961, Ser. No. 128,237
2 Claims. (Cl. 136—89)

Figure 3:
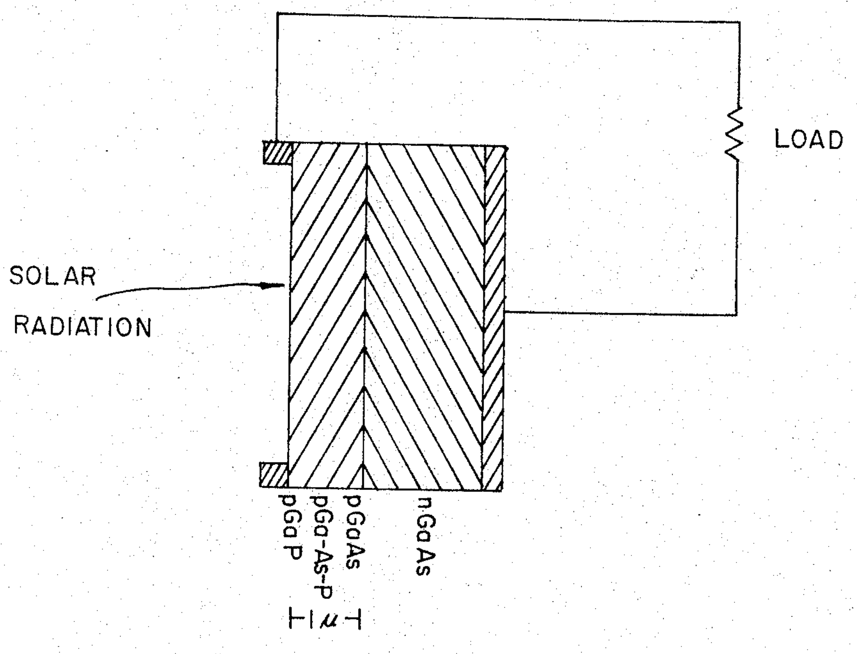

The present invention relates to a method for the production of epitaxial films of large single crystals of inorganic compounds and to articles of manufacture based upon the novel process. Epitaxial films which may be prepared in accordance with the invention described herein are prepared from volatile compounds of elements boron, aluminum, gallium and indium of Group III–B of the periodic system having atomic weights of from 10 to 119 with volatile compounds and elements of phosphorus, arsenic, Sb, and Bi, Group V–B having atomic weights of from 29 to 133. Typical compounds within this group include the binary compounds boron phosphide, gallium arsenide, indium arsenide, gallium phosphide and indium phosphide. As examples of ternary compositions within the defined group are those having the formulae $GaAs_xP_{1-x}$ and $InAs_xP_{1-x}$, $x$ having a numerical value greater than zero and less than 1.

The epitaxial films of the present invention are characterized as graded energy gap crystals. A graded energy gap crystal is characterized by a nonuniformity of composition which results in a corresponding nonuniformity in the forbidden energy gap of the material. The nonuniformity of the forbidden energy gap may be one of gradual increase or decrease in a given direction in a linear or non-linear manner or any other type of profile. The range over which the forbidden energy gap can vary is governed by the elemental components that make up the crystal. For the materials of the present invention the energy gap of the crystal may vary from about 0.17 to about 5.9. It is an object of the invention to provide the novel graded energy gap epitaxial films by a new process which makes possible the controlled grading in any desired profile. It is also an objective of the invention to provide articles of manufacture such as junction type photovoltaic cells, photoelectro magnetic energy conversion cells, transistors, and photoconductors.

It is an object of the invention to provide a new and economical method for the production of the above described types of crystals and devices which are characterized as epitaxial single crystals having a graded forbidden energy gap.

A still further object of this invention is the formation and deposition of epitaxial films of the above-described material upon substrates of the same or different materials.

The III–B and V–B compounds of this invention are of unusual purity and have the necessary electrical properties for use as semiconductor components and are prepared by the reaction of a gaseous III–B compound, such as boron halide and a gaseous V–B compound, such as phosphorus halide in the presence of hydrogen. Examples of boron compounds which are gaseous under the present reaction conditions include the boron halides, e.g., boron trichloride, boron tribromide, and boron triiodide; and also alkyl boron compounds such as trimethyl boron, triethyl boron, tripropyl boron, triisopropyl boron, and tri-tert-butyl boron, as well as alkylated boranes, such as ethyl alkylated pentaborane, and ethyl alkylated decaborane having variable degrees of alkylation; and boron hydrides including diborane, pentaborane and decaborane. Other Group III–B starting materials which are employed in the present invention include the corresponding halides and alkyl compounds of aluminum, gallium and indium. Such metals are preferably employed as the halides, for example, the chlorides, bromides and iodides, although the various alkyl and halo-alkyl derivatives may similarly be used, e.g., trimethyl gallium, trimethyl aluminum, trimethyl indium, triethyl gallium, methyl gallium dichloride, triethyl aluminum and triisobutyl aluminum. The group V–B elements employed per se, or compounds thereof which are of particular utility include phosphorus, arsenic, antimony, and bismuth as well as the halides, hydrides and alkyl derivatives. The elements or their chlorides are preferred as the source material for the Group V–B components employed in the present method. The phosphorus halides which are contemplated include phosphorus trichloride, phosphorus tribromide and phosphorus triiodide, phosphorus pentachloride and phosphorus pentabromide.

In conducting the vapor phase reaction between the Group III–B and the Group V–B component for the production of a crystalline solid III–B—V–B compound, it is essential that gaseous hydrogen be present in the system, and that oxidizing gases be excluded. However, when the Group III–B and/or V–B hydrides are used it is unnecessary to use molecular hydrogen, but it may be used as a carrier. The mole fraction of the III–B component in the gas phase (calculated as the mole fraction of the monatomic form of the III–B compound or element) preferably is from 0.01 to 0.15, while the mole fraction of the V–B component is from 0.05 to 0.50 (also calculated with respect to the monatomic form of the V–B compound or element). The mole fraction of the hydrogen may vary in the range of from 0.35 to 0.94. It should be recognized that this representation of partial pressure imposes no limitation upon the total pressure in the system which may vary in the range from 0.1 microns to several atmospheres, for example, 7500 mm. Hg.

The mole fraction of the Group V–B starting material such as halide, for example, phosphorus trichloride, is preferably at least equivalent to, and still more preferably greater than the mole fraction of the Group III–B halide, for example, gallium trichloride, or other Group III–B compound which is employed. A preferred embodiment is the use of a mole fraction for the Group V–B compound which is at least twice that of the Group III–B compound. The mole fraction of hydrogen should then be at least twice that of the combined mole fraction of the Group III and Group V halides.

The temperature used in carrying out the reaction between the above described III–B compound and the V–B compound will generally be above about 400° C. to as much as 1500° C., a preferred operating range being from 600° C. to 1300° C. Still more preferred ranges of temperatures for making individual products constituting species within the generic temperature range are:

| | ° C. |
|---|---|
| BP | 700–1200 |
| InP | 500–1000 |
| GaP | 700–1200 |
| GaAs | 600–1200 |
| InAs | 500–900 |
| AlP | 500–1000 |
| AlAs | 700–1200 |
| InSb | 400–500 |
| GaSb | 500–650 |
| AlSb | 700–1000 |
| BN | 800–1200 |
| AlN | 600–1200 |

The only temperature requirements are that the temperatures within the reservoir containing the III–B source and in the tube containing the V–B compound or element be maintained above the dew points of the vaporized components therein. For the III–B compound this is usually within the range of from 80–1000° C. and for the V–B compound, from −100 to 400° C. The time required for the reaction is dependent upon the temperature and the degree of mixing and reacting. The III–B and V–B gaseous components may be introduced individually through nozzles, or may be premixed as desired.

The apparatus employed in carrying out the process of the present invention may be any of a number of types. The simplest type constitutes a closed tube of a refractory material such as glass, quartz or a ceramic tube such as mullite into which the starting reactant materials are introduced together with the hydrogen vapor. The tube is then sealed off and subjected to temperatures within the range of from 400 to 1500° C. for a period of from less than one minute to one hour or more, until the reaction is complete.

The contacting and vapor phase precipitation may be carried out in a closed system which is completely sealed off after the hydrogen is introduced with the III–B compound and the V–B compound, or by use of a continuous gas flow system. The pressure which is obtained in the single-vessel, closed system corresponds to the pressure exerted by the added hydrogen vapor at the operating temperature. The pressure in the system may be varied over a considerable range such as from 0.1 microns to a 10 atmospheres, a preferred range being from 0.5 to 1.0 atmosphere.

On a larger scale, the present process is operated as a continuous flow system. This may constitute a simple reaction tube in which the substrate crystal is located and in which the hydrogen gas is then passed to flush oxygen from the system. Into this tube are passed the III–B and V–B reactants carried by hydrogen along the same or one or more additional conduits. The III–V compound formed in the reaction tube deposits as an epitaxial layer on the substrate crystal. Various other modifications including horizontal and vertical tubes are also contemplated, and recycle systems in which the exit gas after precipitation of the single crystal product is returned to the system is also desirable, particularly in larger scale installations.

In addition to making the epitaxial films by providing separate sources of the Group III component and the Group V component it is also possible to make the epitaxially grown crystals of the present invention by reacting hydrogen chloride, hydrogen bromide, or hydrogen iodide with a III–V compound at a sufficiently elevated temperature to provide gaseous products consisting of Group III compounds and Group V elements or compounds. These gaseous reaction products will then further react in a region of the system at lower temperature to redeposit the original III–V compound. Consequently the present process is adaptable to a wide variety of starting materials and may also be used to obtain products of very high purity by employing the III–B compound for redeposition. The reaction system accordingly may consist of a number of zones to provide for the introduction of volatile components which undergo reaction to form the ultimate III–V expitaxial film in the form of a graded gap product.

An advantage of the present method for the production of epitaxial films of III–B—V–B compounds by the reaction in the vapor phase of a Group III–B compound and a Group V–B compound is the ease of obtaining high purity products. In contrast to this method, the conventional method for the preparation of III–V compounds beginning with the respective elements from the Group III and Group V series requires a difficult purification technique for the metals. The conventional purification procedures are not as effective when dealing with the metals in contrast to the compounds employed in the present invention. For example, distillation, recrystallization and other conventional purification methods are readily applicable to the starting compounds employed in the present process. Furthermore, the high-temperature vapor-phase reaction employed in the present method inherently introduces another factor favoring the production of pure materials, since the vaporization and decomposition of the respective Group III and Group V compounds, e.g., the halides, results in a further rejection of impurities. The desired reaction for the production of the III–B—V–B compound occurs between the Group III–B compound, the Group V–B compound, and hydrogen to yield the III–V compound. As a result, it is found that unusually pure materials which are of utility in various electrical and electronic applications such as in the manufacture of semiconductors are readily obtained.

The most important aspect of this invention is the provision of a means of preparing and depositing graded energy gap epitaxial films of the purified single crystal material onto various substrates. The deposited graded gap crystals existing as films of any desired thickness permit the fabrication of new electronic devices discussed hereinafter. The characteristic feature of epitaxial film formation is that starting with a given substrate material, e.g., gallium arsenide, having a certain lattice structure and oriented in any direction, a film or overgrowth of the same or different material may be vapor-deposited upon the substrate. The vapor deposit has an orderly atomic lattice and settling upon the substrate assumes as a mirror-image the same lattice structure and geometric configuration of the substrate. When using a certain material, e.g., gallium arsenide, as the substrate and another material, e.g., indium phosphide as the film deposit it is necessary that lattice distances of the deposit material closely approximate those of the substrate in order to obtain an epitaxial film.

The present invention provides for a novel process for preparing graded energy gap crystals which permits precise control of the gradation of the energy gap along the crystal. Heretofore, graded energy gap crystals have been prepared by employing diffusion techniques wherein one component was diffused into a crystal made up of one or more other components, for example diffusing phosphorus into a gallium arsenide crystal. However, the gradation of the energy gap in crystals prepared in this manner is limited to the profile that is governed by the diffusion process and no wide control of the graded gap profile is possible. A second method that has been employed to make graded energy gap crystals has been to grow the crystals from the melt while gradually changing the melt composition and thus gradually changing the composition of the solidifying crystal. However, this method is readily adaptable only to large crystals and also does not readily permit control of melt composition and particularly over wide ranges of alteration in melt components.

The advance which has been made by the present invention is a greatly improved control of the gradation of the composition of the crystal and hence the gradation of the energy gap of the crystal. Any desired gradation profile can readily be attained in the product crystal by the present process by regulating the composition of the reactant gases. Furthermore, the dimensions of the graded gap crystal prepared by the present process can be controlled over a wide range from a fraction of a micron in thickness to several millimeters in thickness or larger.

A particular advantage of the present method for the production of epitaxial films of III–V—V–B compounds by the reaction in the vapor phase of a Group III–B compound and a volatile Group V–B compound in the presence of hydrogen is that in forming the epitaxial layer on the substrate, the substrate is not affected and therefore sharp changes in impurity concentration can be formed. By this method it is possible to prepare sharp and narrow junctions, such as p-n junctions, which cannot be prepared by the conventional methods of diffusing and alloying.

The growing of a graded gap film by the process of the present invention is carried out by placing a single crystal, polished and oriented, of the substrate material in a Si or other tube. The foundation material is thus available for the manufacture of an epitaxial film which will have the further characteristic of a graded gap structure. In order to conduct this process the reactants are supplied at controlled rates in order to vary gradually the proportions of the III and the V components in the ultimate product. When streams of hydrogen are employed to carry the reactants into the reaction zone, separate streams of hydrogen which may be of equal or unequal volume flow are led through reservoirs containing the reactants, heated to appropriate temperatures to maintain the desired vapor pressure of the reactant. For example, the employment of one region at a considerably higher temperature will introduce relatively larger proportions of such reactant. The separate streams of hydrogen carrying, for example, gallium chloride, indium chloride and arsenic chloride are led into the silica tube containing the substrate crystal and heated to the reaction temperature. A single crystal film of compound, in the present example, $Ga_{0.85}In_{0.15}As$, deposits on the substrate and is oriented in the same direction as the substrate. With continued flow of the three respective reactants, the gradation to obtain a higher proportion of indium with a decrease of gallium is carried out by uniformly programming the flow rates of the three components. For example, with the growth of the crystal a uniform increase in the indium chloride addition with a corresponding equal diminution of the gallium chloride flow yields a composition at an intermediate point corresponding to $Ga_{0.63}In_{0.37}As$. With further growing of the graded epitaxial film the composition of the mixed binary crystal is further varied at the continuous rate described above to obtain a final composition corresponding to the formula $Ga_{0.20}In_{0.80}As$. In the more general case the compound $M_xR_{(1-x)}T$ where $x$ can be any value from zero to one depends upon the relative concentration or partial pressure of the M reactant relative to the R reactant in the reactor tube. In this manner the composition of the depositing material can be gradually altered in accordance with any desired profile including a linear relationship, an exponential relationship or any other shape such as sinusoidal. This result is accomplished by altering the relative flow rates of the reactants entering the reaction zone for example, by controlling the relative flow rates of hydrogen which carry the reactants from the separate reservoirs of the reactants. Other methods for controlling the addition rate of the respective reactants are temperature control of the reservoir of a volatilizable component, such as phosphorus or arsenic chloride, or of the source of the single source of two components, e.g., a III–V compound such as gallium arsenide which decomposes in the presence of HCl to be carried as a gaseous stream of gallium chloride, elemental arsenic and hydrogen into the reaction zone.

The introduction of dopant materials in accordance with a graded schedule is also a part of the present invention. Thus the desired doping material for introducing zinc into epitaxial gallium arsenide is similarly controllable to provide a continuous or discontinuous variation of the zinc content at various levels of the graded gap epitaxial film.

The thickness of the epitaxial film may be controlled as desired and dependent upon reaction conditions such as temperatures within the reactor, hydrogen flow rates and time of reaction. In general, the formation of large single crystals and thicker layers is favored by higher temperatures as defined above, and lower hydrogen pressures and larger flow rates.

As stated hereinbefore, the epitaxial films formed in accordance with this invention comprise compounds formed from elements of Group III–B of the periodic system and particularly those having atomic weights of from 10 to 119 and elements selected from Group V–B having atomic weights of from 29 to 133. Included in this group of compounds are the nitrides, phosphides, arsenides and antimonides of boron, aluminum, gallium and indium. The bismuthides and thallium compounds, while operable, are less suitable. In addition to the use of the above compounds by themselves, mixtures of these compounds are also contemplated as epitaxial films, e.g., aluminum nitride and indium antimonide mixed in varying proportions when produced by the instant process produce suitable semi-conductor compositions.

Representative individual binary crystals of the Group III and Group V components contemplated in this invention are listed in Table I with the value of their forbidden energy gap.

*Table I*

| Compound: | Energy gap, electron volts |
|---|---|
| BP | 5.9 |
| BAs | 4.0 |
| AlP | 3.0 |
| GaP | 2.29 |
| AlSb | 1.55 |
| GaAs | 1.35 |
| InP | 1.25 |
| GaSb | 0.80 |
| InAs | 0.37 |
| InSb | 0.17 |

It is well known that combinations of these compounds can be formed to give mixed binary crystals, including ternary and quaternary compositions, which have a value of the forbidden energy gap different from those of the two parent binary crystals and usually having a value that is intermediate between those of the parent binary crystals. For example, the forbidden energy gap of $GaP_{.5}As_{.5}$ is about 2.0 electron volts. Other such combinations have the formulae $B_xAl_{1-x}P$, $Al_xGa_{1-x}P$, $GaP_xAs_{1-x}$, $In_xGa_{1-x}As$, $InSb_xAs_{1-x}$, $Ga_xAl_{1-x}As$, $In_xGa_{1-x}Sb$, $In_xGa_{1-x}Sb_yAs_{1-y}$, and $GaP_x(As_ySb_{1-x})_{1-x}$, where $x$ and $y$ have a numerical value greater than zero and less than one. As the composition of the mixed binary crystals is gradually altered, i.e., as the value of $x$ and $y$ is altered, the corresponding value of the energy gap is also gradually and uniformly altered. Thus it is possible by the process of the present invention to grow crystals having a gradation of energy gap which varies over a wide range. For example, starting with a substrate of a gallium phosphide crystal $GaP_xAs_{(1-x)}$ is epitaxially deposited on the substrate while varying $x$ from one to zero as the growth progresses, then $Ga_xIn_{(1-x)}As$ is epitaxially deposited while varying $x$ from one to zero, then $InAs_xSb_{(1-x)}$ is epitaxially deposited while varying $x$ from one to zero. The resulting crystal thus has an energy gap of about 2.29 on one face and an energy gap of about 0.17 on the opposite face.

A diagram of this crystal and its graded gap profile is represented in FIGURE 1.

It is readily apparent that any profile of gradation of the energy gap can be made by altering the composition of the growing crystal as desired.

Materials useful as substrates herein include the same materials used in the epitaxial films as just described and, in addition, compounds of elements of Groups II and VI (II–VI compounds) and compounds of Groups I and VII elements (I–VII compounds), and the elements silicon and germanium are suitable substrates. Suitable dimensions of the seed crystal are 1 mm. thick, 10 mm. wide and 15–20 mm. long, although larger or smaller crystals may be used. In a similar manner single crystals of II–VI compounds such as the sulfides, selenides and tellurides of beryllium, zinc, cadmium, and mercury are likewise used as substrates for epitaxial overgrowths of III–V compounds. Similarly, single crystal II–VI compounds having the cubic sodium chloride type structure may be used as substrates for epitaxial growth of the III–V compounds when the II–VI crystal face upon which growth is to occur is the (III) crystallographic face. In this manner the oxides, sulfides, selenides and tellurides of magnesium, calcium, strontium and barium, as well as cadmium oxide, are used as substrates. Preferred II–VI compounds include zinc sulfide, zinc selenide, zinc telluride, cadmium sulfide, cadmium selenide, cadmium telluride, mercury sulfide, mercury selenide, mercury telluride, beryllium sulfide, beryllium selenide and beryllium telluride.

As will be described hereinafter, the materials used herein either as films or substrates or both may be used in a purified state or containing small amounts of foreign materials as "doping" agents.

The significance of structures having epitaxial films is that electronic devices utilizing "surface junctions" may readily be fabricated. Devices utilizing n-p or p-n junctions are readily fabricated by vapor depositing the host material containing the desired amount and kind of impurity, hence, conductivity type, upon a substrate having a different conductivity type. In order to obtain a vapor deposit having the desired conductivity type and resistivity, trace amounts of an impurity, e.g., an element or compound thereof selected from Group II of the periodic system, e.g., beryllium, magnesium, zinc, cadmium and mercury are incorporated into the reaction components in order to produce p-type conductivity, and tin or a tin compound such as tin tetrachloride or an element from Group VI, e.g., sulfur, selenium and tellurium, to produce n-type conductivity. These "impurities" are carried over with the reactant materials into the vapor phase and deposited in a uniform dispersion in the epitaxial film of the formed product on the substrate. Since the proportion of dopant deposited with the III–V compound is not necessarily equal to the proportion in the reactant gases the quantity of dopant added corresponds to the level of carrier concentration desired in epitaxial film to be formed.

The doping element may be introduced in any manner known in the art, for example, by chemical combination with or physical dispersion within the reactants. Other examples include adding volatile dopant compounds such as $SnCl_4$ to the reservoir of the Group III–B and/or V–B components, or the dopant can be added with a separate stream of hydrogen from a separate reservoir.

The substrate materials used herein may be doped by conventional means known to the art. For example, the doping agent may be introduced in elemental form or as a volatile compound of the dopant element during preparation of the substrate crystal in the same manner described above for doping the epitaxial film. Also, the dopant may be added to a melt of the substrate compound during crystal growth of the compound. Another method of doping is by diffusing the dopant element directly into the substrate compound at elevated temperatures.

The quantity of dopant used will be controlled by the electrical properties desired in the final product. Suitable amounts contemplated herein range from $1\times10^{15}$ to $5\times10^{20}$ atoms/cc. of product.

Vapor deposits of the purified material having the same conductivity type as the substrate may be utilized to form intrinsic $pp^+$ or $nn^+$ regions.

As mentioned above, a plurality of layers of epitaxial films may be deposited upon the substrate material. This is accomplished, e.g., by vapor depositing consecutive layers one upon the other. For example, a first film of one of the materials described herein, e.g., gallium arsenide is vapor deposited upon a substrate of germanium. Subsequently, a quantity of the same material with different doping agents or different concentrations of the same dopant or another of the described materials may be vapor deposited from starting materials comprising these elements with a fresh quantity of hydrogen as a second epitaxial film over the epitaxial film of gallium arsenide already deposited on the substrate. This procedure with any desired combination layers can be repeated any number of times wherein one or more of the deposited layers has a graded forbidden energy gap as prepared by the method of this invention.

*Example I*

This example illustrates the formation and deposition of an epitaxial graded gap film on n-type GaAs as the substrate.

A polished crystal of n-type GaAs one millimeter thick and containing $1\times10^{17}$ carriers/cc. is placed in a fused silica reaction tube located in a furnace. The GaAs crystal is placed on a silica support inside said tube. The reaction tube is heated to 800° C. and a stream of hydrogen is directed through the tube for 15 minutes to remove oxygen from the surface of the GaAs.

A stream of hydrogen is then directed through a reservoir of $GaBr_3$ maintained at about 210° C. thus vaporizing the $GaBr_3$ which is then carried by the hydrogen through a heated tube from the reservoir to the reaction tube containing the GaAs substrate crystal.

Meanwhile, separate streams of hydrogen are conducted through separate tubes containing in one of them a reservoir of arsenic heated to about 530° C. and in the other a reservoir of selenium (as a doping component) heated to about 300° C. From the heated tubes the arsenic and selenium are carried by the hydrogen on through the tubes to the reaction tube. In the system the mole fractions of the $GaBr_3$, As and $H_2$ are 0.05, 0.15 and 0.80, respectively. The separate streams of vaporized $GaBr_3$, As and selenium conjoin in the fused silica reaction tube where a reaction occurs between the gallium and arsenic in which a single crystal film of n-type gallium arsenide begins to form on the substrate crystal of GaAs. After the film begins to form, the hydrogen flow rate through the $GaBr_3$ reservoir is gradually reduced while at the same time the flow rate of a hydrogen stream through a separate tube leading to the reaction tube and containing a reservoir of $InCl_3$ heated to about 440° C. is started and gradually increased so that the mole fraction of the sum of the two Group III components is maintained about constant in the reaction tube. During the interval a single crystal deposit of $Ga_xIn_{(1-x)}As$ is formed on the substrate with $x$ decreasing from one to zero as the deposition proceeds. When the hydrogen flow rate through the $GaBr_3$ reservoir has been reduced to zero, the hydrogen flow rate through the arsenic reservoir is gradually reduced while at the same time the flow rate of a hydrogen stream through still another separate tube leading to the reaction tube and containing a reservoir of $SbCl_3$ heated to about 160° C. is started and gradually increased so that the mole fraction of the sum of the two Group V components is maintained about constant in the reaction tube. During this interval a single crystal deposit of $InAs_xSb_{(1-x)}$ is formed on the substrate with $x$ decreasing from one to zero as the deposition proceeds. The hydrogen flow rates through all of the tubes are then terminated. The epitaxially grown crystal removed from the reaction tube is composed of gallium arsenide on one (bottom) face and indium antimonide, n-type, on the opposite (top) face and contains about $10^{17}$ carriers per cc. The side edges of the crystal after lapping them are of graded composition from GaAs through InAs to InSb.

Metallic leads are attached to two aforesaid graded composition opposite edges of the crystal and the crystal is placed in a magnetic field of about 10,000 gauss as shown in FIGURE 2. Upon irradiating the GaAs face of the crystal with radiation from a hot body heated to about 2000° C., electrical potential is generated in the crystal. The efficiency of conversion of the radiant energy falling on the crystal to electrical energy withdrawn from the crystal is about 30%.

In general, the relative positioning of the face of the crystal is such as to receive the incoming radiation. The direction between the two leads at the side edges of the crystal then establish a base direction, together with the direction of variation of the composition of the epitaxial layer, so that for effective operation of the photo cell, the direction of the magnetic field is at least partly in the direction of the normal to these two critical directions.

The photovoltaic cells of the present invention are based upon the various mixed binary compositions with a graded energy gap as described above. The general formula for these compositions is $M_xR_{(1-x)}T_yZ_{(1-y)}$ wherein M and R are different elements of Group III–B having an atomic weight of from 10 to 119, and T and Z are different elements of Group V–B having an atomic weight of from 29 to 133 and wherein $x$ and $y$ vary in the range of values of zero to one.

In a preferred embodiment of the photoelectromagnetic cell the relationship between the chemical elements constituting the graded forbidden energy gap epitaxial film is such that M is of smaller atomic weight than R, and T is of smaller weight than Z and $x$ and $y$ continually decrease from a maximum value of one to a minimum value of zero in the direction from the front, light receptive surface to the back of the crystal.

Figure 4:
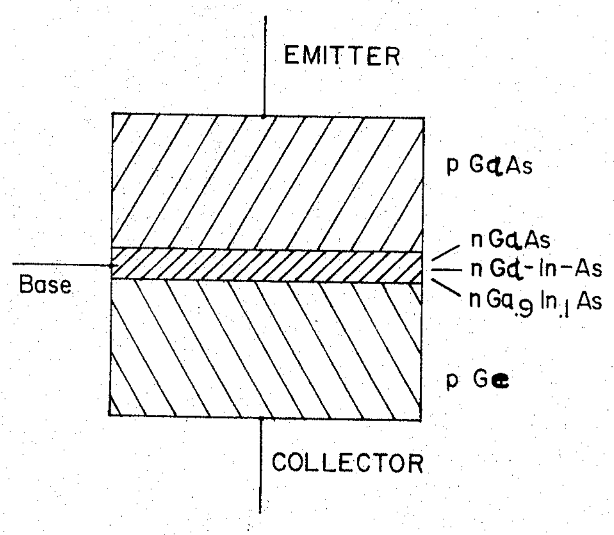

The drawings of the present invention illustrate certain specific embodiments of the invention. FIGURE 1 shows a graded forbidden energy gap profile produced as an epitaxial deposit upon a substrate. FIGURE 2 shows a photoelectromagnetic cell based upon a graded energy gap material produced in accordance with the process of the present invention. FIGURE 3 shows a solar cell, and FIGURE 4 illustrates a transistor employing the present graded forbidden energy gap materials.

*Example 2*

This example illustrates the formation and deposition of a p-type epitaxial graded gap film on n-type GaAs as the substrate, in a solar cell as illustrated in FIGURE 3.

The same general procedure outlined in Example 1 is repeated. The substrate crystal in the reaction tube is an n-type ($10^{17}$ carriers per cc.) GaAs crystal heated to about 800° C. GaAs, p-type with $10^{20}$ carriers per cc., is contained in one reservoir heated to about 900° C. and p-type GaP ($10^{20}$ carriers per cc.) is contained in a second reservoir heated to about 900° C. After flowing hydrogen through the reaction tube for 15 minutes to remove oxygen from the substrate crystal, a stream of hydrogen chloride gas is initiated through the GaAs reservoir and into the reaction tube. After GaAs begins to epitaxially deposit on the GaAs substrate crystal the flow rate of the hydrogen chloride through the GaAs reservoir is slowly reduced while at the same time the flow rate of a stream of hydrogen chloride through the GaP reservoir is initiated and gradually increased. During this interval $GaAs_xP_{(1-x)}$ is deposited with $x$ decreasing from one to zero as the deposit proceeds. After the flow rate through the GaAs reservoir has reached zero, the hydrogen chloride stream through the GaP reservoir is also terminated. The epitaxially grown crystal in the reaction tube is composed of GaAs on one (bottom) face and GaP on the opposite (top) face and contains about $10^{20}$ carriers per cc. (p-type). Thus the crystal consists of a graded energy gap, p-type epitaxial film on an n-type substrate. Metallic leads are attached to the n-type substrate and the p-type film and connected through an external lead. Upon irradiating the p-type face of the crystal with solar radiation, electrical potential is generated in the crystal. The efficiency of conversion of the radiant energy falling on the crystal to electrical energy withdrawn from the crystal is about 19%.

*Example 3*

The same general procedure outlined in Example 1 is repeated. A AgI substrate crystal is heated to about 500° C. Indium trichloride, heated to about 400° C. is provided in one reservoir; antimony trichloride heated to about 160° C. is provided in a second reservoir; and elemental arsenic heated to about 500° C. is provided in a third reservoir. Separate streams of hydrogen are led through the $InCl_3$ and $SbCl_3$ reservoirs and into the reaction chamber. After deposition of InSb commences on the AgI substrate crystal, the flow rate of the hydrogen stream through the $SbCl_3$ reservoir is gradually reduced while at the same time the flow rate of a hydrogen stream through the As reservoir is initiated and gradually increased so that the mole fraction of the sum of the two Group V components is maintained about constant in the reaction tube. During this interval $InSb_xAs_{(1-x)}$ is deposited while $x$ decreases from one to zero as the deposition proceeds. When the flow rate of the hydrogen stream through the SbCl has reached zero, the flow of hydrogen through the other reservoirs is also terminated. The crystal which has been epitaxially grown on the AgI substrate is composed of InSb next to the AgI and of InAs on the face which is last to deposit. Tests show that this crystal is a photoconductor.

*Example 4.—(Transistor as shown in FIG. 4 on germanium substrate)*

The same general procedure outlined in Example 1 is repeated. The substrate single crystal in the reaction chamber is p-type ($10^{15}$ carriers per cc.) germanium heated about 800° C. Reservoirs are provided which contain, respectvely, $GaCl_3$ heated to about 130° C., $InCl_3$ heated to about 440° C., As heated to about 530° C., selenium heated to about 250° C., and $ZnCl_2$ heated to about 360° C. The last two components are used as dopants. After flushing the reaction tube with hydrogen, streams of hydrogen of about equal flow rate are led through the $GaCl_3$ and $InCl_3$ reservoirs and a stream of hydrogen of about double flow rate is led through the As reservoir. At the same time a stream of hydrogen is led through the selenium reservoir. After the deposition on the substrate crystal commences the flow rate of the hydrogen stream through the $GaCl_3$ reservoir is gradually increased while at the same time the flow rate of hydrogen through the $InCl_3$ reservoir is gradually decreased so that the mole fraction of the sum of the two Group III components is maintained about constant in the reaction tube. When the flow rate of the hydrogen stream through the $InCl_3$ reservoir reaches zero, the flow of hydrogen through the arsenic reservoir is terminated while at the same time the flow of hydrogen through the $ZnCl_2$ reservoir is initiated. After operating with these latter conditions for a period of about 15 minutes, all gas flows are terminated. The crystal which has been epitaxially grown on the p-type germanium crystal is composed of an n-type layer of $Ga_{.9}In_{.1}As$ next to the germanium crystal with a composition gradation to GaAs and then a p-type layer of GaAs. The intermediate graded gap n-type film contains $10^{16}$ carriers per cc. and the last to deposit p-type GaAs contains $10^{18}$ carriers per cc. After lapping the edges of the crystal, leads are connected to the three separate p, n, p regions and the crystal exhibits transistor action with improved emitter efficiency and improved high frequency response.

It will be seen that the products obtained according to the present invention have a variety of applications. For example, in electronic devices where it is desirable to have a substantially inert non-conducting base for III–V graded gap semiconductors, the product described in Example 3 is highly suitable. Where it is desired to obtain semiconductor components having semiconducting properties in the base material as well as in the epitaxial film, those products described in Examples 1, 2 and 4 above are of particular value.

Electronic devices may also be fabricated wherein a semiconducting component comprising an epitaxial, graded gap film of III–V compositions is deposited on substrates of metallic conductors having cubic crystal structure, such as gold, silver, calcium, cerium, cobalt, iron, iridium, lanthanum, nickel, palladium, platinum, rhodium, strontium, thorium and copper, and alloys such as Al-Zn, SbCoMn, BTi and $CR_2Ti$.

Various other modifications of the instant invention will be apparent to those skilled in the art without departing from the spirit and scope thereof.

What is claimed is:

1. A photovoltaic cell comprising a crystal comprising a light receptive front surface base layer of crystalline material selected from the class consisting of Group III—Group V compounds, Group II—Group VI compounds, Group I—Group VII compounds, silicon and germanium, an epitaxial layer deposited on the back thereof, the said epitaxial layer being composed of merging regions of composition $M_xR_{(1-x)}T_yZ_{(1-y)}$ wherein M is of smaller atomic weight than R and both M and R are elements of group III–B having an atomic weight of from 10 to 119 and T is of smaller atomic weight than Z and both T and Z are elements of Group V–B having an atomic weight of from 29 to 133, wherein at least one of $x$ and $y$ continually decreases in the aforesaid epitaxial layer from a maximum value of one to a minimum value of zero in the direction from front to back of the crystal whereby the forbidden energy gap decreases from front to back across the profile of the said epitaxial layer, and said crystal being disposed in a magnetic field oriented in a direction different from the direction of said variation of the compositon of said epitaxial layer, and electrical leads in contact with two opposite side edges of the said crystal whereby the normal to the direction between the two contacts and to the direction of said variation of the composition of said epitaxial layer is at least partly in the direction of the magnetc field.

2. A photovoltaic cell comprising a crystal comprising a light receptive front surface base layer of crystalline Group III–B arsenide, an epitaxial layer deposited on the back thereof, the said epitaxial layer being composed of merging regions of composition of the sequence $Ga_xIn_{(1-x)}As$, InAs, $InAs_xSb_{(1-x)}$, wherein $x$ continually decreases in each of the two aforesaid three-component regions from a maximum value of one to a minimum value of zero in the direction from front to back of the crystal whereby the forbidden energy gap decreases from front to back across the profile of the said epitaxial layer and said crystal being disposed in a magnetic field oriented in a direction different from the direction of said variation of the composition of said epitaxial layer, and electrical leads in contact with two opposite side edges of the said crystal whereby the normal to the direction between the two contacts and to the direction of said variation of the composition of said epitaxial layer is at least partly in the direction of the magnetic field.

References Cited

UNITED STATES PATENTS

| | | | |
|---|---|---|---|
| 2,763,581 | 9/1956 | Freedman | 148—1.5 |
| 2,929,859 | 3/1960 | Loferski | 136—89 |
| 2,961,475 | 11/1960 | Sommers | 148—33 |
| 3,057,762 | 10/1962 | Gans | 148—33.4 |
| 3,072,507 | 1/1963 | Anderson et al. | 148—175 X |
| 3,102,828 | 9/1963 | Courvoisier | 148—1.5 X |
| 3,111,611 | 11/1963 | Hunter | 317—235 |
| 3,132,057 | 5/1964 | Greenberg | 148—33.4 |
| 3,186,873 | 6/1965 | Dunlap | 136—89 |
| 3,211,970 | 10/1965 | Christian | 317—235 |

FOREIGN PATENTS 1,029,941 5/1958 Germany.

OTHER REFERENCES

Anderson, R. L.: "IBM Technical Disclosure Bulletin," vol. 3, No. 11, April 1961, page 32.

Cherry, W. R.: "Proceedings, 14th Annual Power Sources Conference," May 17, 18, 19, 1960. Power Sources Division, U.S. Army Signal Research and Development Laboratories, Fort Monmouth, N.J., October 1960, pages 37–42.

Kurnick et al.: Journal of Applied Physics, volume 27, No. 3, March 1956, pages 278–285.

Miller, B.: Aviation Week, July 31, 1961, pages 62–67.

Wolf, M.: Proceedings of the IRE., vol 48, No. 7, July 1960, pages 1246–61.

ALLEN B. CURTIS, *Primary Examiner.*

WINSTON A. DOUGLAS, *Examiner.*

W. C. TOWNSEND, A. M. BEKELMAN, *Assistant Examiners*

UNITED STATES PATENT OFFICE
CERTIFICATE OF CORRECTION

Patent No. 3,322,575 May 30, 1967

Robert A. Ruehrwein

It is certified that error appears in the above identified patent and that said Letters Patent are hereby corrected as shown below:

Column 6, line 36, "$(As_ySb_{1-x})$" should read -- $(As_ySb_{1-y})$ --.

Signed and sealed this 31st day of March 1970.

(SEAL)
Attest:

Edward M. Fletcher, Jr.
Attesting Officer

WILLIAM E. SCHUYLER, JR.
Commissioner of Patents